United States Patent [19]

Villalon

[11] Patent Number: 5,073,508
[45] Date of Patent: Dec. 17, 1991

[54] METHOD OF MANUFACTURING AN INTEGRATED SEMICONDUCTOR CIRCUIT INCLUDING A BIPOLAR HETEROJUNCTION TRANSISTOR AND/OR BURIED RESISTORS

[75] Inventor: Claudine Villalon, Chennevieres-sur-Marne, France

[73] Assignee: U.S. Philips Corporation, Tarrytown, N.Y.

[21] Appl. No.: 583,270

[22] Filed: Sep. 14, 1990

[30] Foreign Application Priority Data

Sep. 21, 1989 [FR] France .................... 89 12405

[51] Int. Cl.$^5$ .................................... H01L 21/265
[52] U.S. Cl. ................................. 437/31; 437/33; 437/133; 437/909; 437/60; 148/DIG. 11; 148/DIG. 72
[58] Field of Search ............. 437/31, 33, 126, 133, 437/909, 60; 148/DIG. 11, DIG. 72

[56] References Cited

U.S. PATENT DOCUMENTS 4,617,724 10/1986 Yokoyama et al. .................. 437/31
4,889,831 12/1989 Ishii et al. .......................... 437/31

Primary Examiner—Brian E. Hearn
Assistant Examiner—Tuan Nguyen
Attorney, Agent, or Firm—Paul R. Miller

[57] ABSTRACT

The invention relates to a method of manufacturing a non-planar HBT transistor comprising first the step of forming the emitter, the step of etching the device around the emitter as far as the level of the base layer, exposing a region for the collector contact, the emitter being protected, and then the step of forming the base contact by self-alignment on the emitter and the collector. This method utilizes steps of profile inversion, during which two dielectric layers of different materials are successively deposited, the first of which has a uniform thickness and the second of which has a non-uniform thickness and which are etched at different rates in order to cause chosen patterns to appear. The invention moreover permits forming concomitantly buried resistors. The device obtained is particularly compact and performant and the method requires only a very limited number of masking steps, which can be realized with a non-critical resolution.

15 Claims, 10 Drawing Sheets

METHOD OF MANUFACTURING AN INTEGRATED SEMICONDUCTOR CIRCUIT INCLUDING A BIPOLAR HETEROJUNCTION TRANSISTOR AND/OR BURIED RESISTORS

The invention relates to a method of manufacturing a semiconductor integrated circuit including a heterojunction bipolar transistor (HBT) and a buried resistor, the said method comprising at least the step of forming on a semiconductor substrate first, second and third semiconductor layers of alternate conductivity types forming p-n junctions, at least one of which is a heterojunction.

The invention further relates to the manufacture of buried resistors of low values often required in integrated circuits.

The invention is used in the manufacture of integrated circuits of high speed and low consumption, for example, formed by means of layers of III-V material on a substrate of III-V material or on a substrate of silicon.

BACKGROUND OF THE INVENTION

A method of manufacturing a non-planar HBT transistor is already known from U.S. Pat. No. 4,731,340. According to this known method, lift-off techniques are used to obtain self-alignment of base contacts on the emitter. A photoresist mask defining an emitter adjacent to the base contact is formed on a support suitable to constitute a bipolar heterojunction of semiconductor material. A base contact is formed by etching through the upper semiconductor layer as far as the heterojunction and a metal is deposited on the lower semiconductor layer of the heterojunction. A dielectric is then deposited on the base contacts formed beforehand and then the photoresist mask is eliminated, which constitutes the technique of lift-off of the dielectric and of the metal in the regions in which they are undesirable. At this instant, the emitter contact can be formed due to the fact that the base contact is still covered by the dielectric. The method is terminated by the formation of an opening as far as the deepest layer and the formation of the collector contact on the layer.

This method offers the advantage of obtaining self-alignment of the base on the emitter region and then forming the emitter contact by a method which is not very critical. Moreover, the edges of the emitter are protected by a dielectric.

However, this method has the disadvantage of not forming the collector contacts sufficiently close to the base contacts, as a result of which the parasitic intrinsic elements associated with the transistor and especially the base-collector capacitances are increased.

The parasitic elements considerably reduce the speed of the HBT transistors. On the other hand, it is important to reduce the dimensions of the HBT transistors in order to reduce their consumption, which also influences the speed.

SUMMARY OF THE INVENTION

Therefore, an object of the invention is to propose a method of manufacturing a HBT transistor, of which not only the base and the emitter are self-aligned, but of which the base-collector distance is reduced without using sophisticated masking methods, which would be expensive or non-reproducible.

Another object of the invention is to provide a method of manufacturing a HBT transistor, whose performances are improved.

Another object of the invention is to propose a method of manufacturing buried resistors, which are formed during the same steps of manufacturing as the HBT transistor. This method carried out conjointly with that of manufacturing the HBT transistor permits obtaining a gain of time in the manufacture of an integrated circuit including both such a transistor and resistors of low values.

The objects of the invention are attained by means of a method as described in the opening paragraph and moreover characterized in that it comprises the following steps:

a) forming the emitter by etching around a first mask the third semiconductor layer as far as the second layer, which results in a relief having a height $y_1$;

b) forming a first uniform dielectric layer $D_1$ having an opening at the surface of the emitter;

c) etching in the opening of a second mask $M_3$ limiting the collector this first dielectric layer $D_1$ and the second semiconductor layer as far as the first layer, forming for the collector a cavity having a transverse dimension $x_1$ satisfying the condition $y_1 < x_1/2$, and then eliminating the masks;

d) depositing a so-called metallic emitter and collector contact layer $C_1$;

e) uniformly depositing a so-called third dielectric layer $D_3$ chosen among the materials that can be etched at the same rate as the first dielectric layer $D_1$ and having the thickness $y_2$ satisfying the condition $y_1 < y_2 < x_1/2$, and then depositing a planarization layer $D_4$;

f) planarizing the device as far as the upper level of the first dielectric layer $D_1$;

g) etching the dielectric layers $D_1$, $D_3$ and $D_4$ as far as the second semiconductor layer, the etching rate of the fourth layer $D_4$ being higher than that of the first and third layers $D_1$ and $D_3$, the edges of the emitter relief and those of the cavity of the collector remaining protected by the first dielectric layer $D_1$;

h) depositing in the opening of a mask defining the bases self-aligned on the emitter a second metallic base contact layer $C_2$.

BRIEF DESCRIPTION OF THE DRAWINGS

In order that the invention may be readily carried out, it will now be described more fully, by way of example, with reference to the accompanying diagrammatic drawings, in which.

DESCRIPTION OF THE INVENTION

Figure 1A:
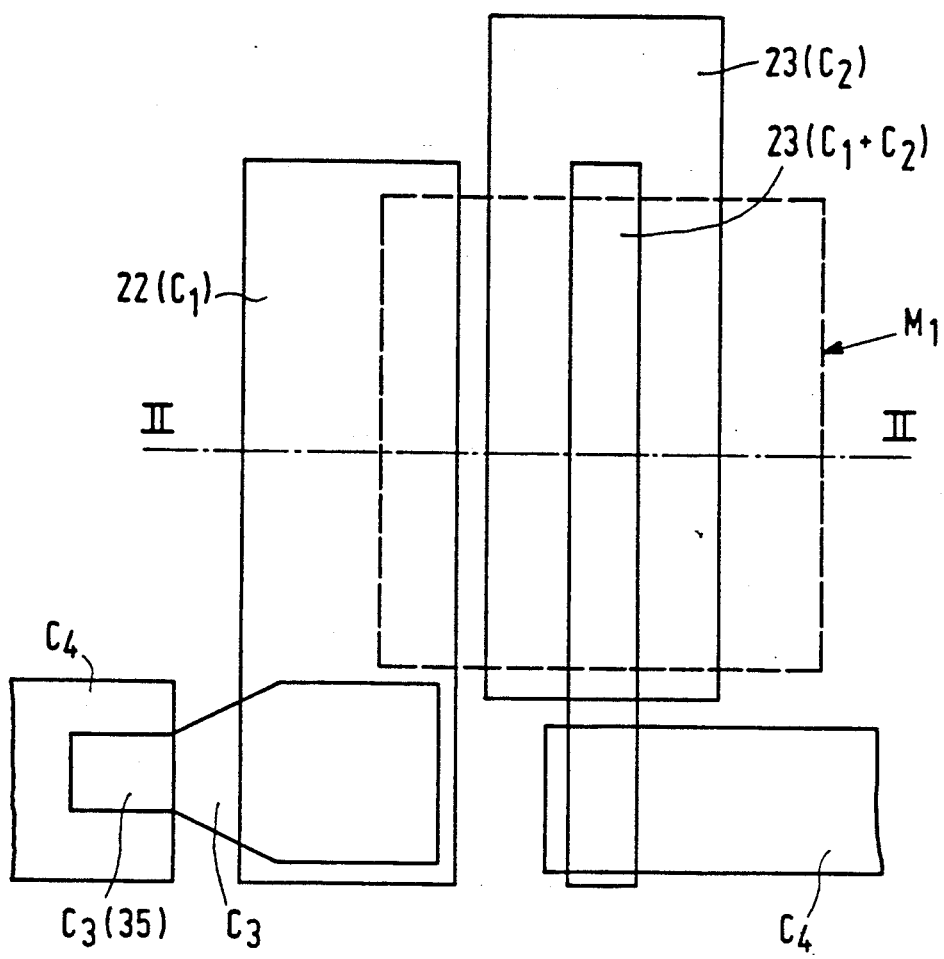
FIG. 1a shows in plan view the HBT transistor of FIG. 1b, moreover provided with the interconnections shown in FIG. 5b.
Figure 2A:
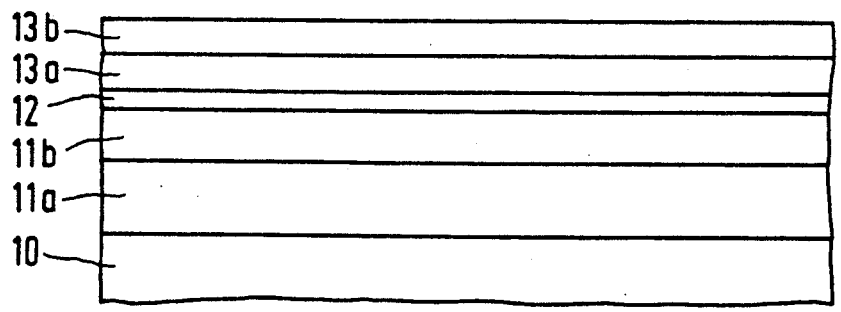
FIGS. 2a to 2o show in sectional view the different steps of the method according to the invention in an embodiment for the manufacture of the HBT transistor.
Figure 2B:
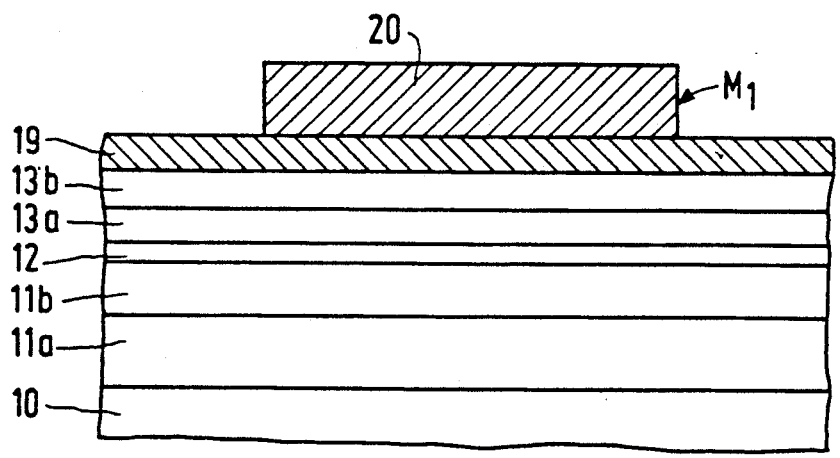
Figure 2C:
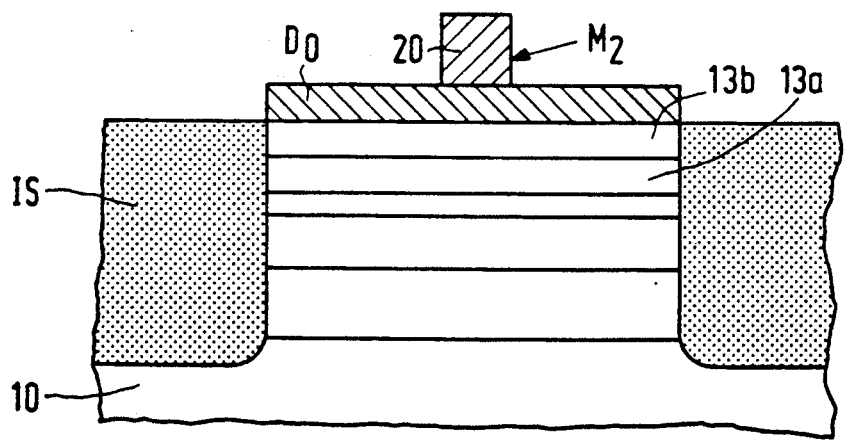
Figure 2D:
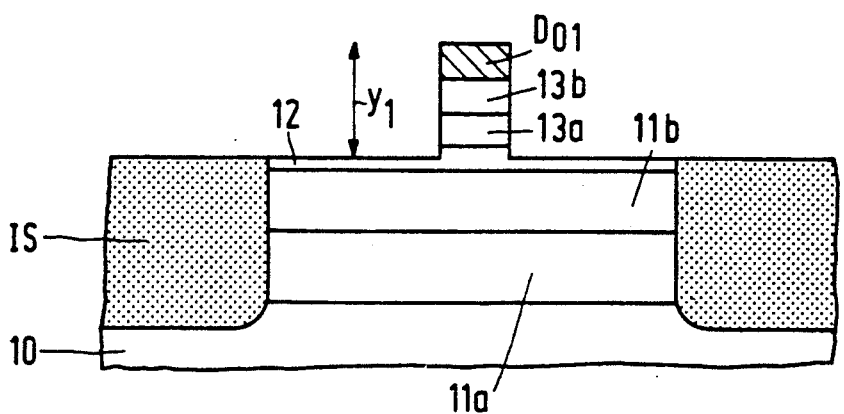
Figure 2E:
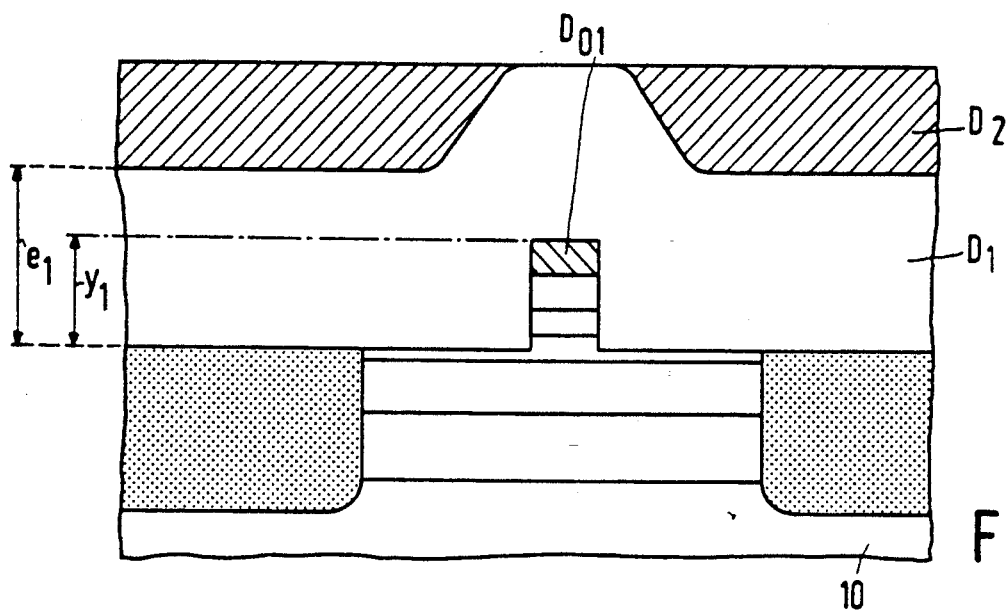
Figure 2F:
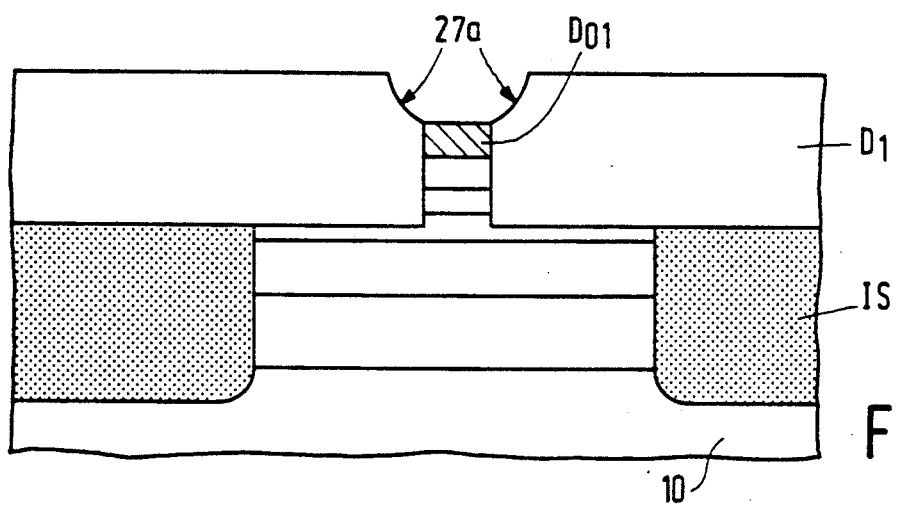
Figure 2G:
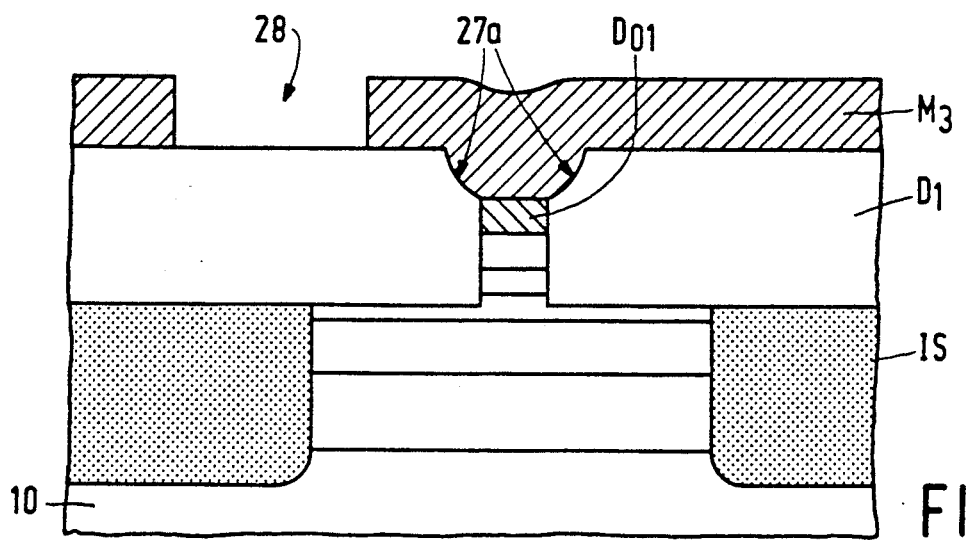
Figure 2H:
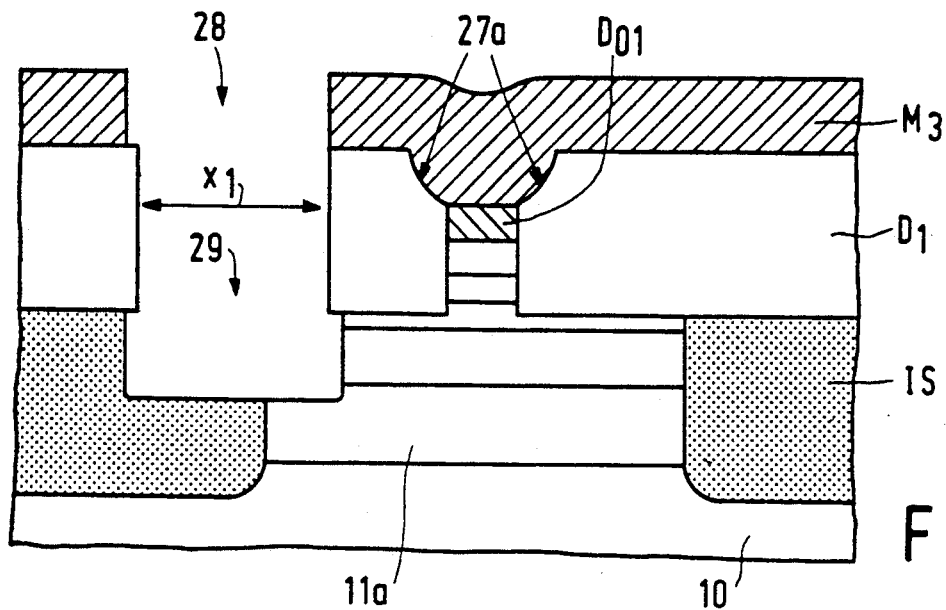
Figure 2I:
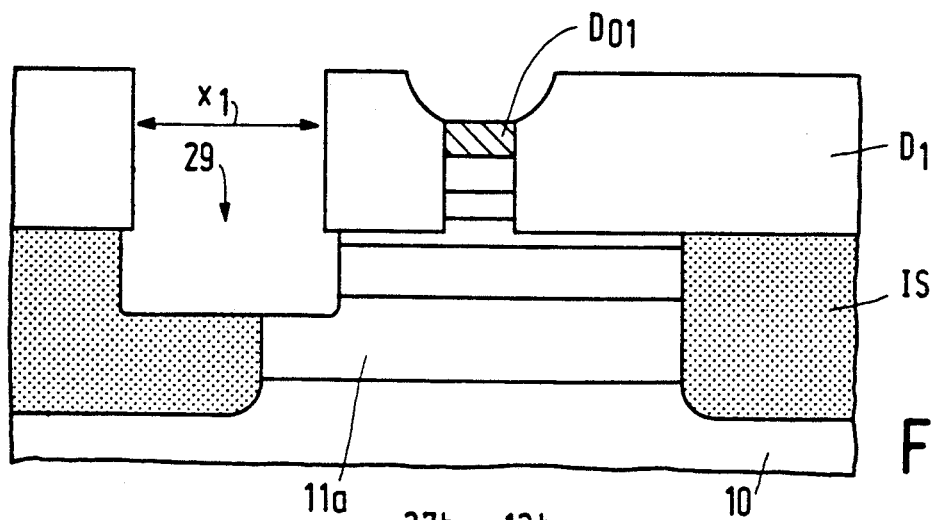
Figure 2J:
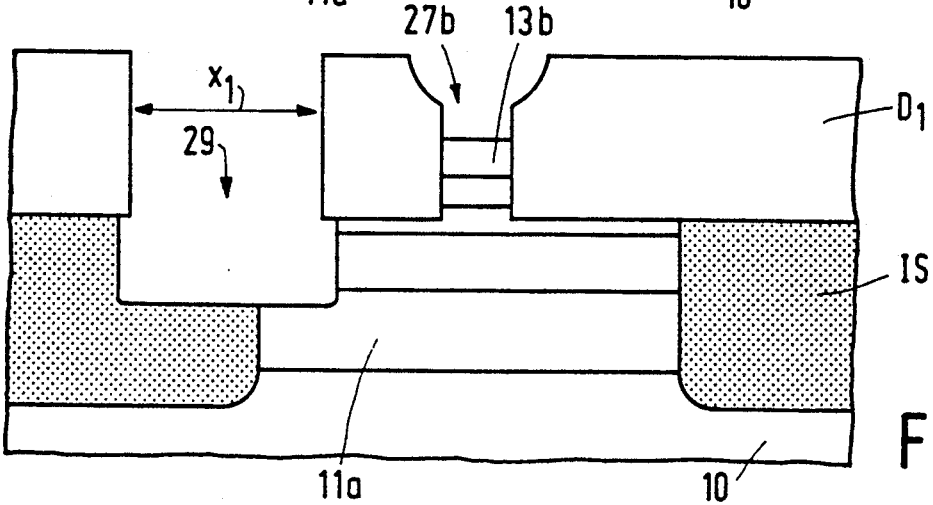
Figure 2K:
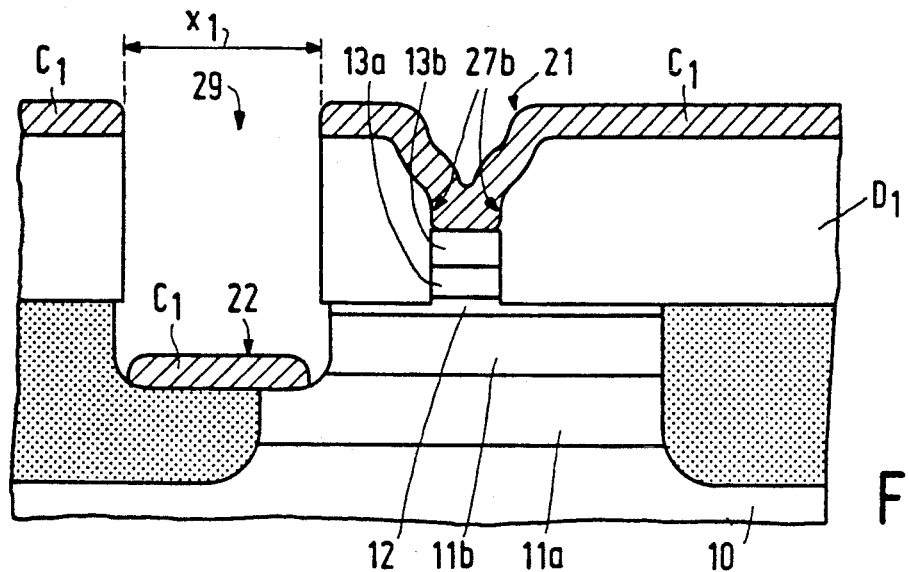
Figure 2L:
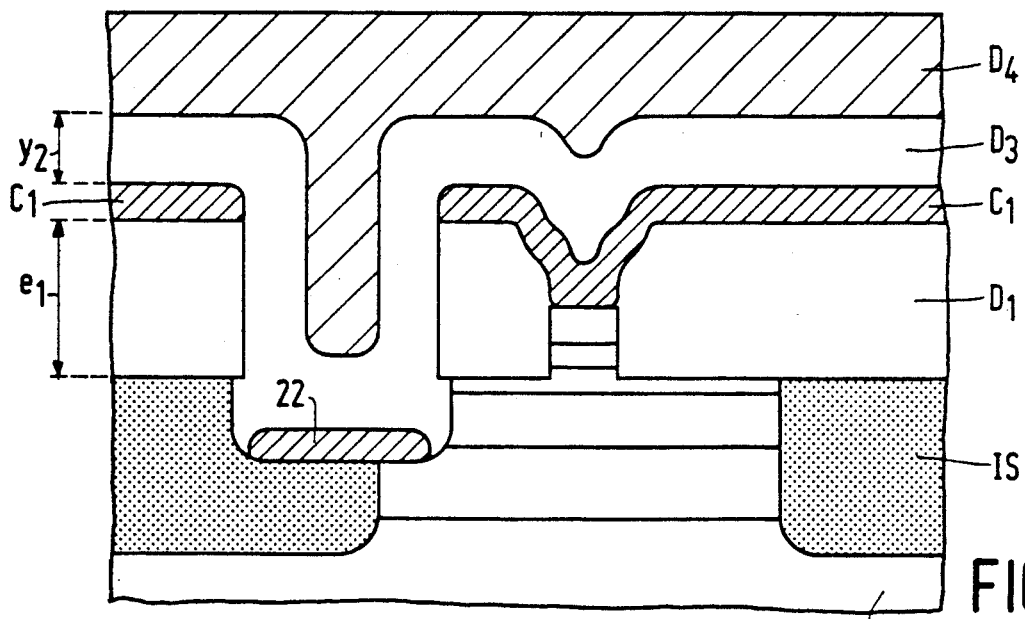
Figure 2M:
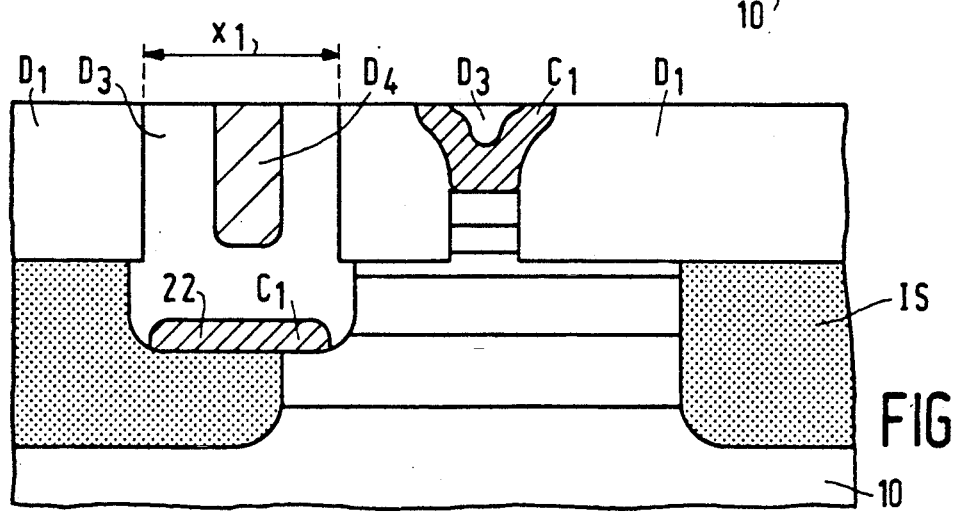
Figure 2N:
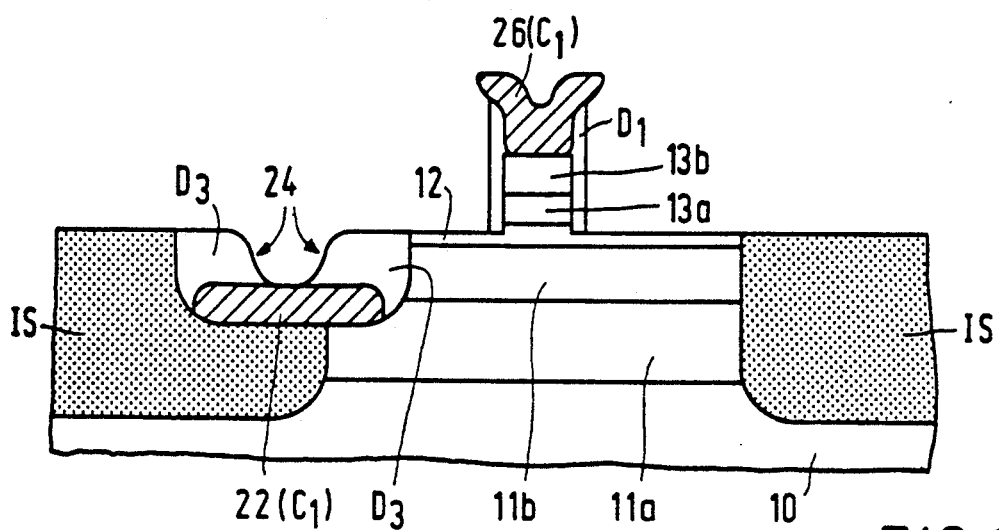
Figure 2O:
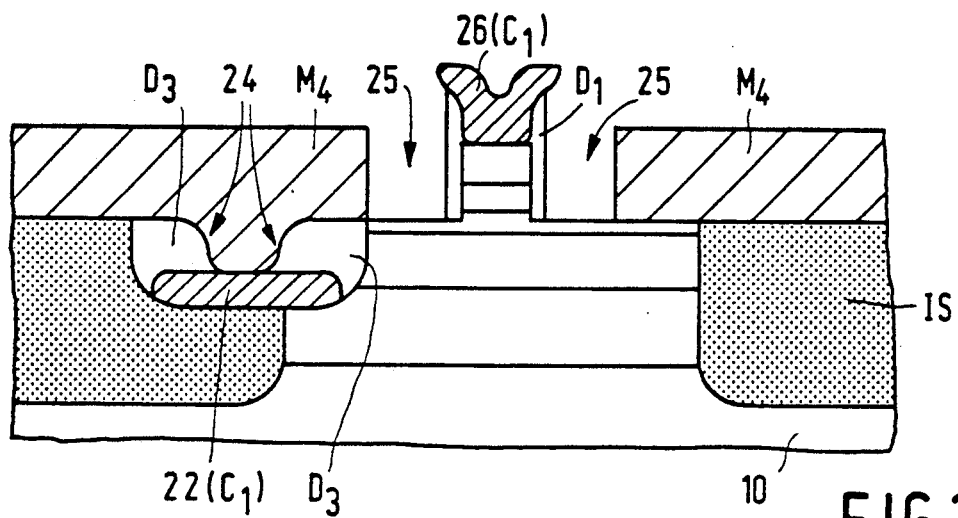

In embodiment, the method of manufacturing a heterojunction bipolar transistor comprises the following steps shown in FIGS. 2a to 2o, which are sectional views taken on the axis II—II of FIG. 1a, which shows the finished HBT transistor in plan view:

a) forming (see FIG. 2a) a substrate 10 of a semiconductor material, favourably semi-isolating gallium arsenide (GaAs), silicon (Si), provided with a layer for adapting the crystal lattice.

b) forming, as shown in the FIG. 2a, by a conventional method of epitaxy a stack of layers of different conductivity types, for example a first n-type layer 11, a second p-type layer 12 and a third n-type layer 13.

The first n-type layer 11 can be formed from two superimposed layers 11a and 11b of the n+ type doped with about $5 \times 10^{18}$ at/cm$^3$ and having a thickness of 0.5 μm for the layer 11a and of the n−type doped with $5 \times 10^{16}$ at/cm$^3$ and having a thickness of about 0.5 μm for the layer 11b. These layers will preferably consist of gallium arsenide (GaAs).

Figure 6:
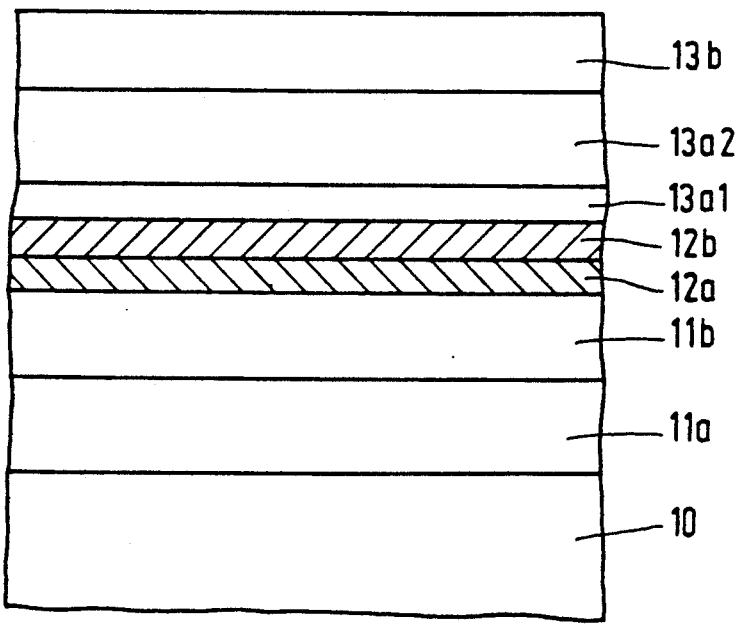
FIG. 6 shows in sectional view a variation of the configuration of layers suitable to obtain a HBT transistor formed on a semiconductor substrate.

The second p-type layer 12 can be formed from two layers 12a and 12b (see FIG. 6); the layer 12a will preferably consist of gallium arsenide (GaAs) of the p+ type doped with $10^{19}$ at/cm$^3$ and having a thickness of 0.1 μm; the layer 12b will preferably consist of gallium arsenide (GaAs) not intentionally doped and having a thickness of 0.01 μm. This variation is shown in sectional view in FIG. 6.

The third n-type layer 13 can be formed from two layers 13a and 13b of the n-type for the layer 13a doped with $5 \times 10^{17}$ at/cm$^3$ and having a thickness of 0.2 μm and of the n+ type for the layer 13b doped with $5 \times 10^{18}$ at/cm$^3$ and having a thickness of 0.2 μm, which will preferably consist of gallium arsenide (GaAs).

The thicknesses and dopings are given by way of example. FIG. 2a is a sectional view of the system of layers 11, 12 and 13 in a more simplified form than in FIG. 6.

In order to form moreover a heterostructure, the layer 13a will preferably consist of gallium aluminium arsenide (GaAlAs). For this purpose, it may also be constituted by two superimposed layers: a first layer 13a$_1$ containing a concentration of aluminium progressively increasing from 0 to 25% and having a thickness of about 0.03 μm and a second layer 13a$_2$ containing 25% of aluminium and having a thickness of about 0.2 μm (see FIG. 6).

The layers 11, 12 and 13 may be formed, for example, by epitaxy methods, such as molecular beam epitaxy or organometallic epitaxy or any other method known to those skilled in the art. Next the following step is carried out:

c) depositing (see FIG. 2b) on the device shown in FIG. 2a a dielectric layer 19 and then depositing a photolacquer layer 20 to form a mask M$_1$.

The dielectric 19 will favourably be silica (SiO$_2$) having a thickness of more than 1 μm. The lacquer layer 20 will favourably have a thickness of about 1.5 μm.

The mask M$_1$ formed by means of the layer 20 by a conventional method known to those skilled in the art is provided to protect the future active region of the HBT transistor during the formation of the isolation regions IS, as shown in FIG. 2c. The dielectric 19 is then etched as far as the upper surface of the layer 13 (for example 13b) of semiconductor material, preferably by dry etching, for example by means of CHF$_3$ and SF$_6$ gases.

The remaining dielectric 19 constitutes a mask D$_0$ and the mask M$_1$ is provided on it. The device thus constituted is then subjected to the following step:

d) deeply implanting, as shown in FIG. 2c, protons or for example, boron to constitute isolation regions IS around the region protected by D$_0$ and M$_1$, which region will constitute the active zone of the transistor; subsequently, at this stage, the mask M$_1$ is eliminated; and e) forming, as shown in FIG. 2c, a mask M$_2$ at the surface of the dielectric layer D$_0$, for example by means of a photosensitive lacquer 20 having a thickness of about 1 μm.

The mask M$_2$ is intended to limit the emitter 13a, 13b of the HBT transistors.

The dimensions of the mask M$_2$ will favourably lie between 0.5 μm and a few microns in the plane of the sectional view of FIG. 2c (sectional view taken on the axis II—II of FIG. 1a) and in the perpendicular direction between 1 μm and several tens of microns.

As shown in FIG. 2d, the device is then subjected to an etching treatment around the mask M$_2$. The layer D$_0$ is first subjected to a dry or wet etching treatment. Subsequently, the layer 13b of GaAs and the layer 13a of GaAlAs are subjected to a dry or wet etching step; the dry etching step may be effected, for example, by means of chlorinated gas, such as CCl$_2$F$_2$, SiCl$_4$, Cl$_2$, BCl$_3$ and their derivatives mixed with CH$_4$H$_2$.

The remaining part of the etching treatment will be effected on the layer 12 or base layer of the p-type made of GaAs or, as the case may be, within this layer (see FIG. 2d).

At the end of this step, if the dielectric D$_0$ is silica, it is eliminated, for example, by means of a chemical bath of weakly diluted HF.

If the dielectric D$_0$ is silicon nitride (SiN), it may be maintained. The emitter pad 13a, 13b, on which the remaining part D$_{01}$ of the layer D$_0$ is disposed, then has a height y$_1$ of the order of 1.5 μm. Further the following step is carried out:

f) depositing a dielectric layer D$_1$, as shown in FIG. 2e, of a material of a type which is deposited as a uniform layer, for example silica (SiO$_2$). The thickness of the layer D$_1$ is then equally large at the surface of the emitter pads 21 as at the surface of the layer 12.

This layer must have a thickness e$_1$ exceeding the height y$_1$ of the emitter pad 21 (FIG. 1b) formed in the step e), on which the remaining mask D$_{01}$ may be disposed, which leads to a minimum thickness of about 600 nm.

This thickness e$_1$ is particularly important due to the fact that it will defined later as the distance between the base 23 of the HBT transistor and its emitter 21. The thickness e$_1$ most favourable for the layer D$_1$ is about equal to two times the height y$_1$ of the emitter pad, which may be covered by M$_2$:

$$e_1 = 2y_1. \tag{1}$$

The next step is then carried out:

g) depositing, as shown in FIG. 2e, a dielectric layer D$_2$ of a type which extends in fluid form, for example an epoxy resin or a photosensitive lacquer. The latter will not be used for its photosensitive properties, but as a layer having on the one hand planarization properties and on the other hand etching properties different from those of the layer $D_1$. Moreover, it extends over a smaller thickness on the emitters, which have at least a smaller dimension, as stated, than on other patterns of the device situated at the same level as the emitter and having larger dimensions. In order to suit the purpose of the invention, this lacquer $D_2$ will be subjected to an insulation at least 4 times stronger than the insulation energy in the normal operating conditions known to those skilled in the art for the use as a conventional mask. Subsequently, it will be subjected to successive sintering steps from about 90° C. to 180° C. Next the following steps are carried out.

h) uniformly etching the layer $D_2$, as shown in FIG. 2e, until the surface of the layer $D_1$ appears above the emitter patterns, for example by RIE etching by means of $SF_6$ and $CHF_3$ gases; then selectively etching the layers $D_1$ and $D_2$ simultaneously at an etching rate of the layer $D_1$ exceeding that of the layer $D_2$ until the upper surface of the emitter pads (for example the upper surface of $D_{01}$ if the latter subsists) appears. This method permits exposing the layer $D_1$, as shown in FIG. 2f, exclusively on the patterns having one of its small dimensions with respect to the other patterns of the integrated circuit situated at the same level. Among the patterns having a small dimension, the emitter pads 13a, 13b are found, on which therefore the layer $D_1$ is exposed.

It should be noted that at the end of this step h) the assembly of the device is protected by a layer of dielectric $D_1$ having openings 27a in the form of dishes of small depth above the patterns, such as the emitters, as shown in FIG. 2f. Then the following steps are carried out:

i) forming, as shown in FIG. 2g, a mask $M_3$ having one opening (or openings) 28 limiting the collector(s) 22 of the HBT transistor and, as the case may be, resistors for the integrated circuit (see FIG. 3); and j) dry etching in the opening 28 of the mask $M_3$, as shown in FIG. 2h, the dielectric $D_1$ by means of, for example, $SF_6$ and $CHF_3$ gases if $D_1$ consists of silica ($SiO_2$) as far as the surface of the semiconductor material, i.e. of the base layer 12 of the p-conductivity type in the example described; then etching, as shown in FIG. 2h, the layer 12 of the p-type and the layer 11 (11b) of the n-type and stopping the etching treatment at the surface of the layer 11a of the n+ type or within this layer (a few tens of nm in addition). The step of etching the semiconductor materials 12 and 11 can be effected by dry etching by means of chlorinated gas, as has been stated above, or by wet etching, for example by means of citric acid mixed with $H_2O_2$.

Figure 3A:
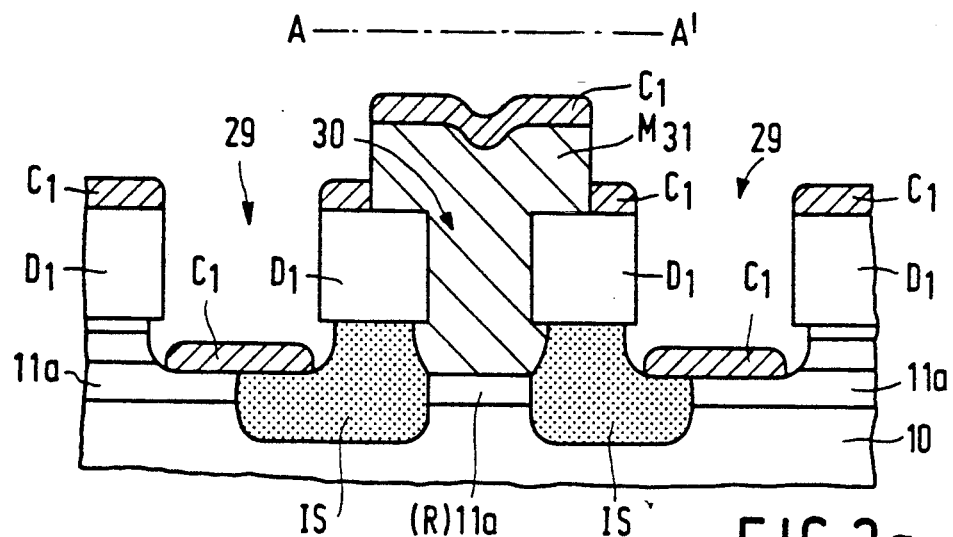
FIGS. 3a to 3h show in sectional view a method of manufacturing resistors R of low values that can be carried out concomitantly with the method of manufacturing the HBT transistor realized in the steps of FIGS. 2a to 2j.
Figure 3B:
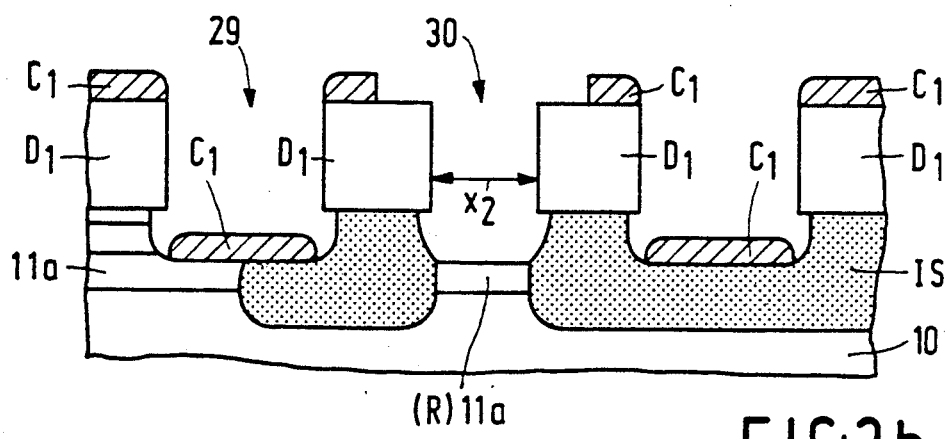

It should be noted that by the method according to the invention resistors R of low values designated as buried resistors can be formed simultaneously with the HBT transistor. The method of manufacturing the resistors R is shown in FIGS. 3a to 3d in a sectional view taken on the axis AA' of FIG. 4 and in FIGS. 3e to 3h in a sectional view taken on the axis BB' of FIG. 4. These resistors shown in plan view in FIG. 4 are formed by means of the layer 11a of the n+ type of GaAs, as shown in FIGS. 3(a-h). These resistors have values depending upon the doping of the layer 11a of the n+ type By this method, typically resistors are obtained of the order of 20Ω/□. In order to form such resistors, as shown in FIG. 4 in plan view, during the steps of forming the HBT transistor, as shown in FIGS. 3a to 3d, the mask $M_3$ will suitably be patterned so that a later opening 30 is formed (see FIGS. 4, 3a to 3d). Especially, it has in the zone of the resistor R an opening which does not exceed a dimension $x_2 < x_1$ according to the axis AA'; moreover, after the opening 30 of the layers is provided as far as the layer 11a of the n+ type, this opening 30 is protected by means of a mask $M_{31}$ so that the following step of forming the HBT can be carried out. The thickness of $M_{31}$ must be substantial, i.e. of the order to 2 to 2.5 μm, in order to protect the location of the future resistor R. The next step is:

k) eventually eliminating the remaining dielectric $D_{01}$, as shown in FIG. 2j, on the emitter pads forming the openings 27b; then depositing a layer $C_1$, as shown in FIG. 2k, in order to form the ohmic contacts of the n-type of the HBT transistor on the collector layer 11a and the emitter 21 and to form the contacts 32 of ends of resistors R.

If the dielectric $D_{01}$ is SiN, it will be eliminated by a comparatively soft dry etching treatment in order not to disturb the n+ layer (13b), which will appear at the surface of the emitter pad 21. $CF_4$ gas is preferably used (see FIG. 2j).

The ohmic contacts $C_1$ are therefore deposited in the following openings (see FIGS. 2k, 3b, 3e and 4):

openings 29 defining the collectors, openings 33 at the surface of the layer 11a on either side of the mask $M_{31}$ viewed along the axis BB' (or openings for resistors). In FIG. 3e, the latter deposit is intended to form the ends 32 of contact connections of the resistors R. In FIG. 3b, collector openings 29 adjacent to the resistor and receiving $C_1$ are shown:

openings 27b in the layer $D_1$ above the emitter pads 13a, 13b.

The metal for forming the layer $C_1$ will favourably be deposited by vaporation in vacuo or by cathode sputtering of an Au-Ge alloy followed by the evaporation or sputtering of a layer of nickel, after which the alloy Au-Ge-Ni will be formed at about 400° C. to 450° C.

The thickness of the layer $C_1$ will favourably be 0.1 to 0.5 μm. The next step is:

l) depositing, as shown in FIG. 2l, a layer of dielectric $D_1$.

Figure 3C:
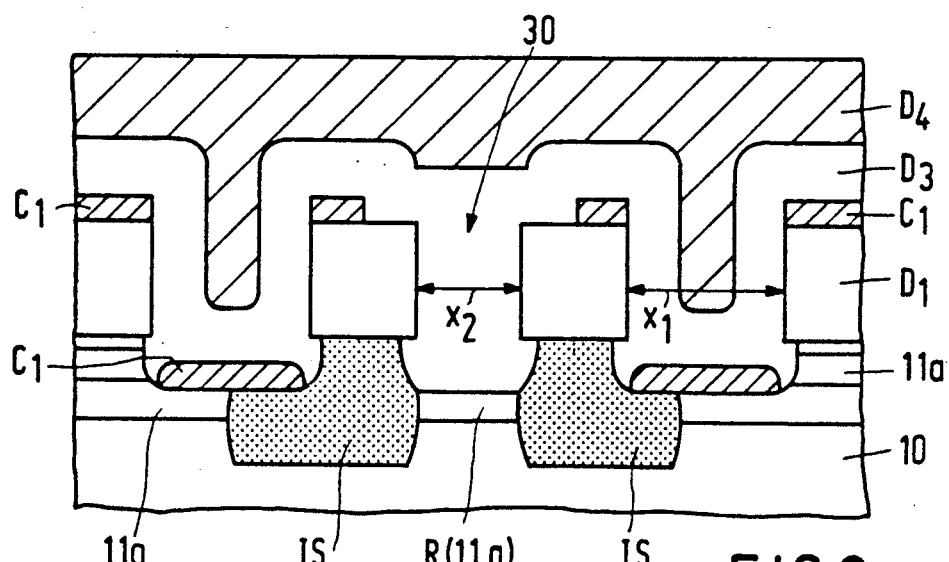
Figure 3D:
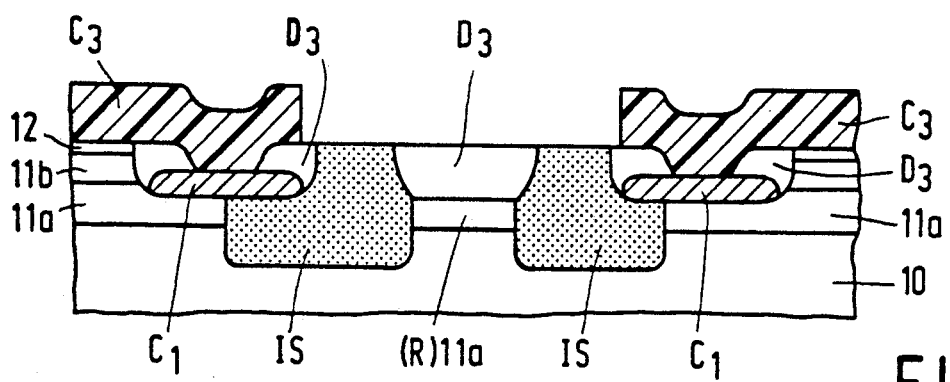
Figure 3E:
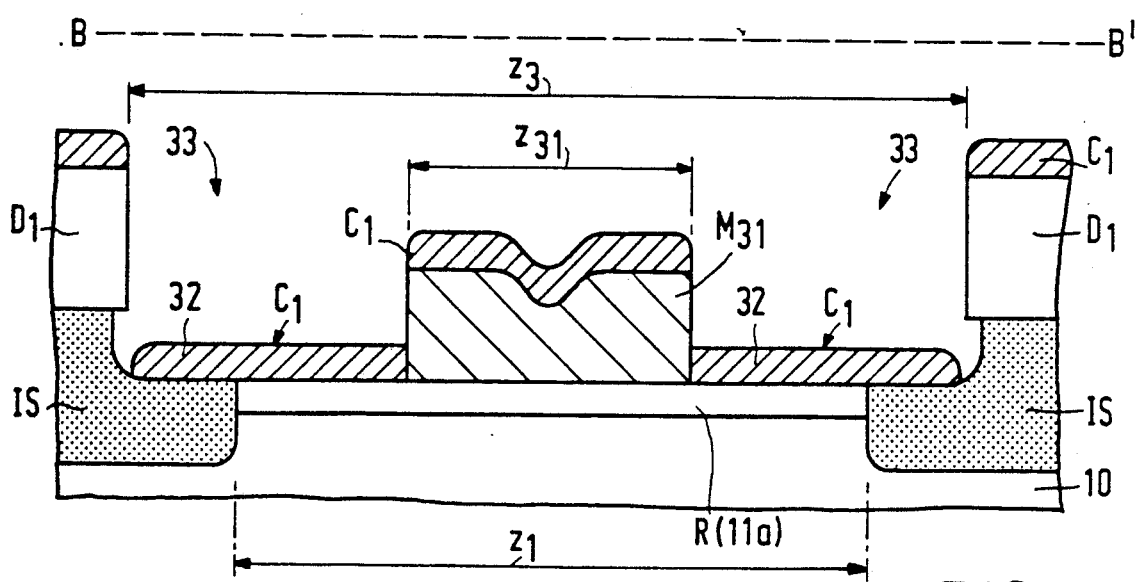
Figure 4:
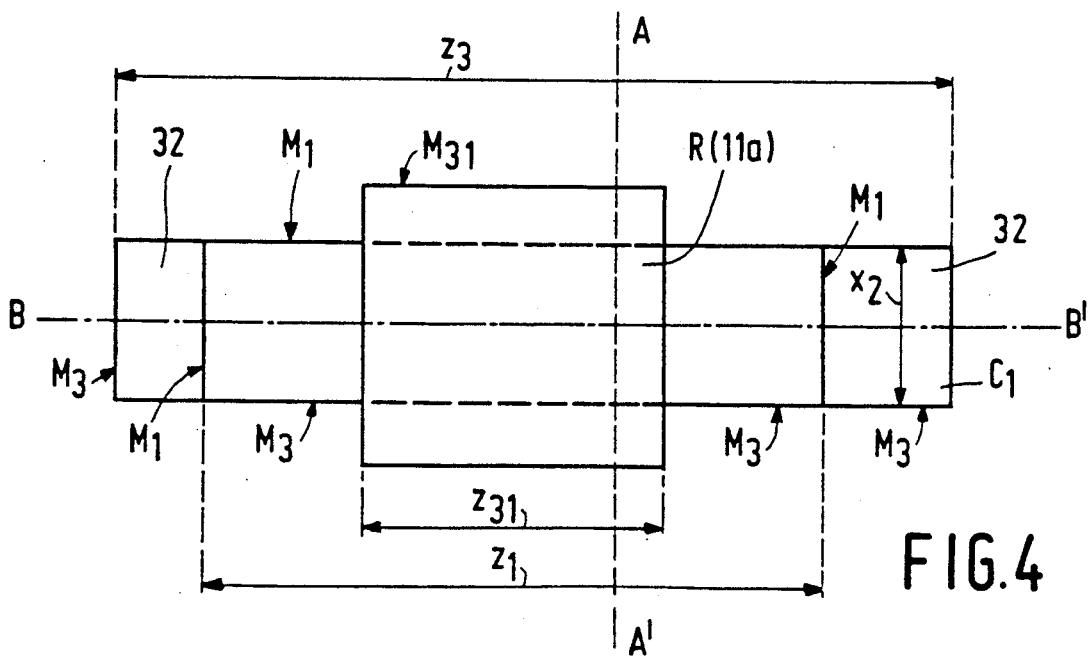
FIG. 4 shows in plan view the resistor R obtained during the steps shown in FIGS. 3a to 3h.

This layer will be deposited also on the resistors R (see FIG. 3c). For this purpose, the mask $M_{31}$ will be eliminated beforehand, which thus results in lift-off of $C_1$ in this region. This layer $D_1$ will preferably consist of silica ($SiO_2$) deposited by a method known to those skilled in the art under the designation of PECVD or CVD. This layer then has a uniform thickness $y_2$, such as:

$$y_2 < e_1 < x_1/2,$$

where $X < 3$ μm is the transverse dimension of the openings 29 having permitted the formation of the collectors 22 when a contact $C_3$ should be formed by interconnection of the collector and where $x_1$ or $x_2 < 3$ μm in all the other cases.

The deposition of the dielectric layer $D_3$ is followed as shown in FIG. 2l, by the deposition of a dielectric layer $D_4$, which will favourably consist of a photosensitive lacquer treated in the same manner as during the step g). This layer will also be deposited on the resistor R (see FIG. 3c). Further the following steps are carried out:

m) etching, as shown in FIG. 2m, the layers $D_3$ and $D_4$ by dry etching by means of fluorinated gas in a uniform manner. The etching rates of the two dielectrics are therefore chosen to be identical. The etching step is carried out as far as the upper level of the metallic layer $C_1$; and n) ion machining the metallic layer $C_1$ (see FIG. 2m). The ion machining step is a mechanical etching step. The metallic layer $C_1$ is withdrawn by this method on the assembly of the dielectric layer $D_1$ except for the emitter region, in which the layer $C_1$ is protected by the dielectric $D_3$ remaining after the preceding step. The resistors R are treated in the same way. The next step is:

o) etching the dielectrics $D_1$, $D_3$, $D_4$ by dry etching, as shown in FIG. 2n; the resistors R are treated in the same way.

The dielectrics $D_1$ and $D_3$, which, as already stated, are of the same material, preferably silica ($SiO_2$), must be etched at identical rates.

Figure 3F:
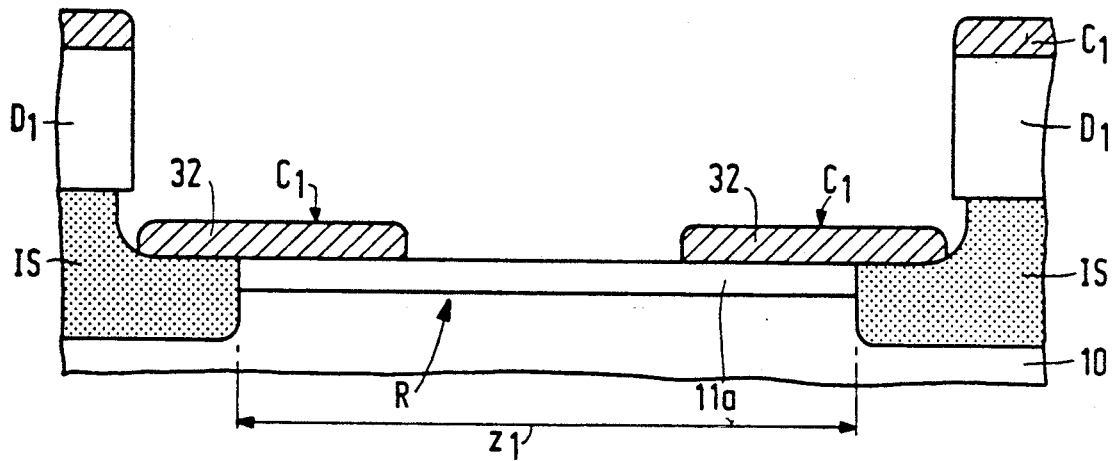
Figure 3G:
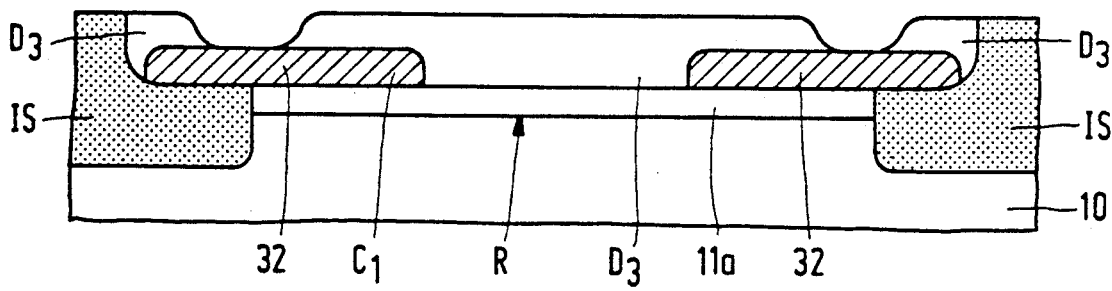

The etching rate of the dielectric $D_4$ will have to be higher than that of $D_1$ and $D_3$ in order to obtain an opening 24 on the collector contacts 22 and, as the case may be, an opening 31 on the pads 32 of contact connections of the resistors R (see FIGS. 2n, 3g).

Figure 1B:
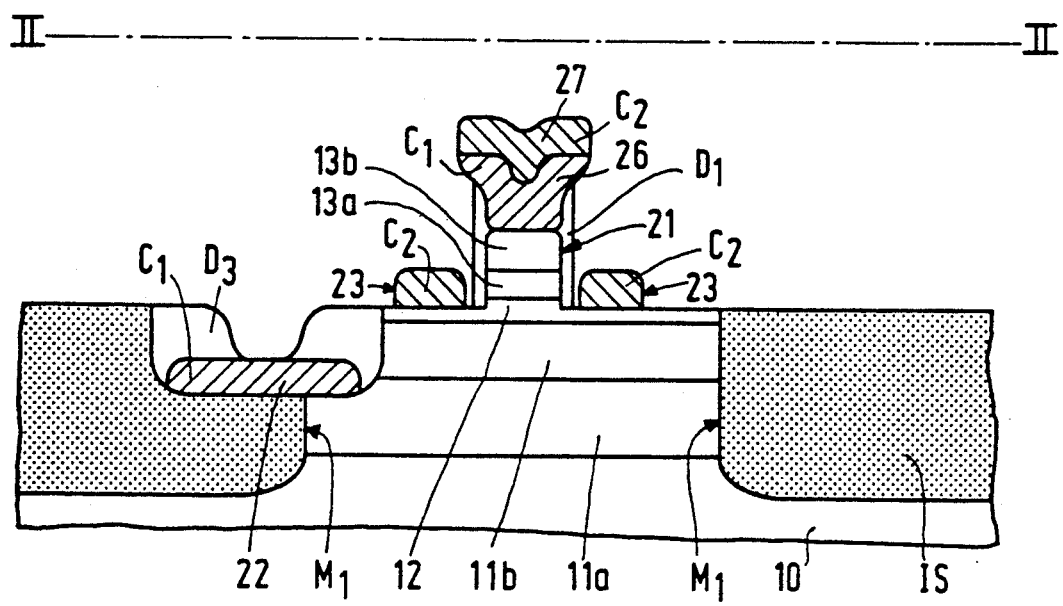
FIG. 1b shows in sectional view the HBT transistor obtained by means of the method according to the invention.

At the end of this step, a protection of the dielectric $D_1$ remains along the edges of the emitter pad 13a, 13b. This protection will facilitate the self-alignment of the base contacts 23 of the HBT in the following step (see FIGS. 2o and 1b):

p) forming, as shown in FIG. 2o, a mask $M_4$ leaving free openings 25 defining the bases of the HBT. These base contacts 23 are of the p-type in the example described. The base contacts will be constituted, as shown in FIG. 1b, by a metallic layer $C_2$, which is deposited on the assembly of the device and particularly in the openings 25 and on the emitter pads 20 of a metal $C_1$ adding an excess thickness 27.

The metal of the layer $C_2$ will be deposited by evaporation in vacuo or cathode sputtering of a multilayer comprising, for example, Ti and then Au, or Ti, Pt, Au. The thicknesses of the different metals do not exceed 100 nm for Ti and Pt and about 200 nm for Au. A sintering step permits then forming the ohmic contact $C_2$. The temperature will preferably be of the order of 350° C., depending upon the doping of the layer 12 of the p-type. Further the problem may arise of forming interconnections with the emitter contact pads (26, 27), base contact pads 23, collector contact pads 22 of ends 32 of resistors R due to the fact that these elements are not planar.

Figure 3H:
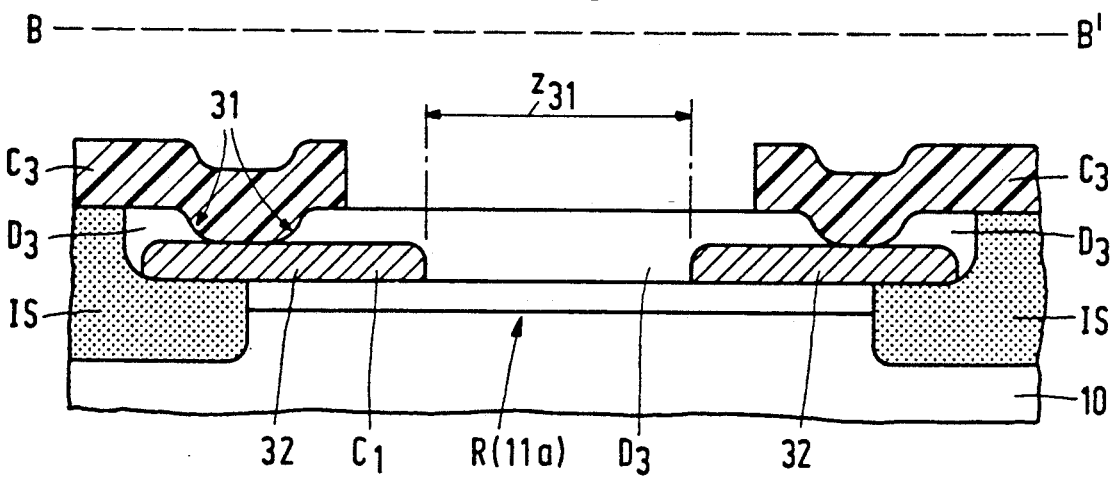
Figure 5A:
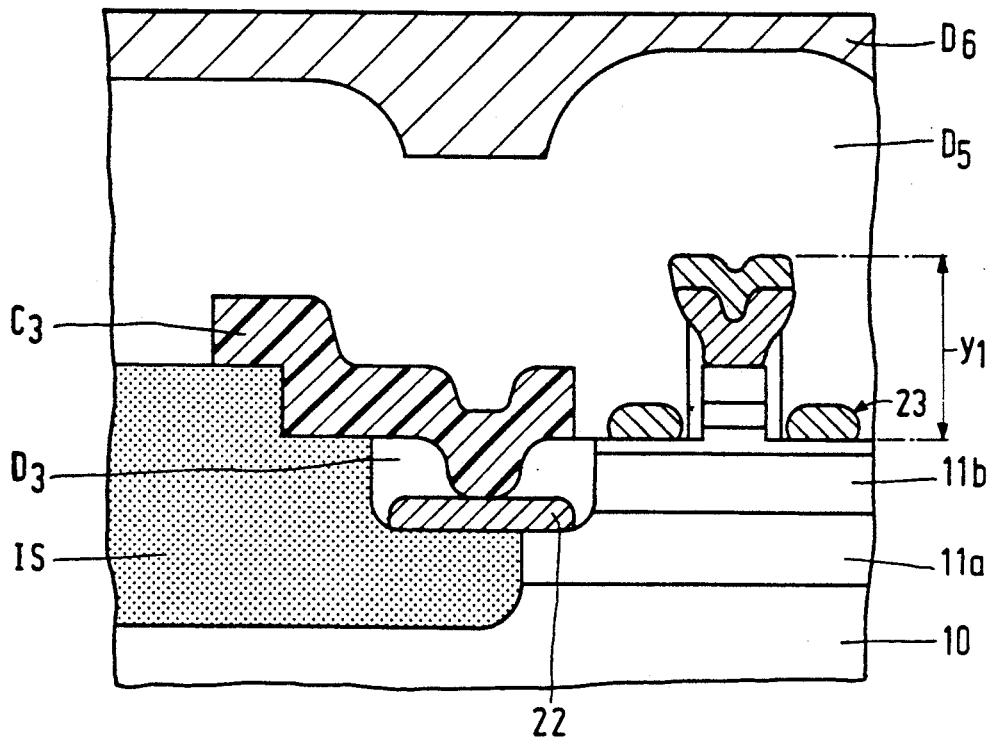
FIGS. 5a and 5b show in sectional view a method of forming interconnections with the electrodes of the HBT transistor of FIG. 1b.
Figure 5B:
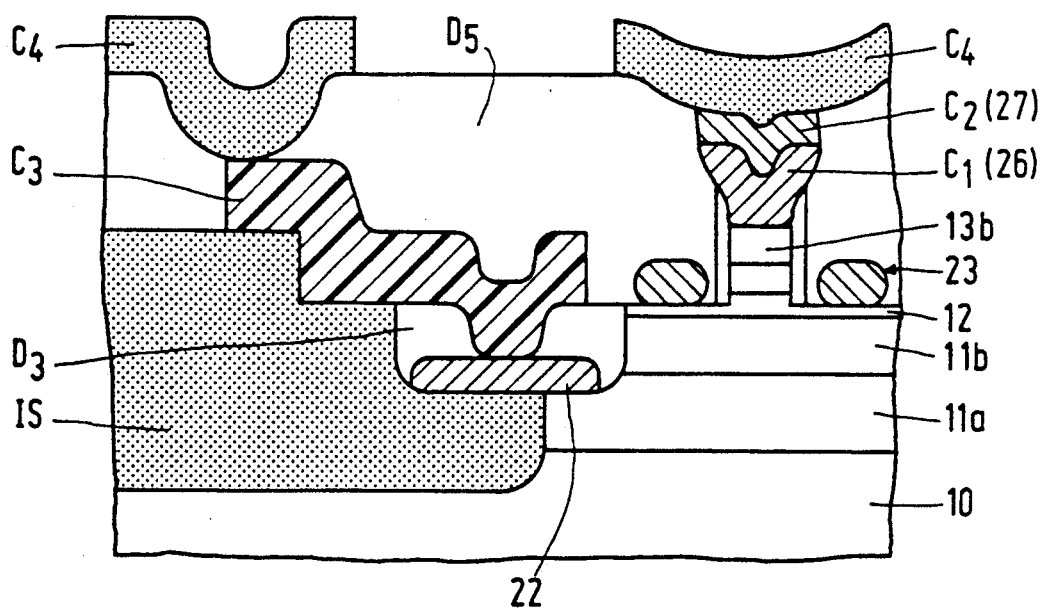

FIGS. 5a and 5b show an embodiment of a method of forming such interconnection lines on the collector 22 and on the emitter 26, 27 of the HBT. FIG. 3h shows a similar example of this method applied to the ends 32 of the resistor R. First lines $C_3$ are formed by raising their level, the remainder of the device being protected. Subsequently, after the protective layer has been eliminated, first a layer $D_5$ identical to $D_1$ described above and then a layer $D_6$ identical to $D_2$ will be deposited, whereupon these layers are etched in a manner identical to that described above; the second etching stage (etching of $D_5$ at a rate exceeding that of $D_6$) being stopped from the appearance of the upper surface of the emitter layers 27 $C_2$ and of the upper end of the line $C_3$.

In order to obtain this result, the end of the line $C_3$, of which the level is higher than the contact (22 for the collector or 32 for the end of the resistor R), with which it establishes the electrical connection, is reduced in width or provided with an appendix having a transverse dimension equivalent to that of the emitter. For example, the form shown in plan view, in FIG. 1a, may be adopted, which illustrates the part 35 reduced in width of $C_3$.

Subsequently, conducting lines $C_4$ are formed, which contact with $C_3$ or with the layers $C_2$ of the emitters by means of these openings.

The lines $C_3$ and $C_4$ are formed by the conventional methods of masking and depositing metallic layers known to those skilled in the art.

The level of the ends of the lines $C_3$ can be raised in that steps or slopes are formed in the semiconductor material 10, as shown especially in FIGS. 5a and 5b.

The connection of the base contacts 23 can be obtained in a quite analogous manner.

I claim:

1. A method of manufacturing a semiconductor integrated circuit including at least one heterojunction bipolar transistor (HBT), said method comprising the steps of (a) forming on a substrate of semiconductor material in sequence at least one first semiconductor layer of a first conductivity type, at least one second semiconductor layer of a second conductivity type, and at least one third semiconductor layer of said first conductivity type, wherein p-n junctions are formed between said first and second semiconductor layers and between said second and third semiconductor layers, and wherein at least one of said p-n junctions is a heterojunction;

(b) forming a first mask on said third semiconductor layer, said first mask having at least two openings;

(c) etching said third semiconductor layer as far as said second semiconductor layer through said first mask to produce a relief structure having a height $y_1$, said relief having said third semiconductor layer for an emitter;

(d) forming a first uniform dielectric layer having a first opening at a surface of said relief;

(e) forming a second mask over said first uniform dielectric layer including said first opening and forming at least one second opening in said second mask, said second opening being laterally separated from said relief;

(f) etching as far as said first semiconductor layer through said second opening to form at least one cavity, said cavity having a transverse dimension $x_1$, where $y_1 < x_1/2$, said first semiconductor layer becoming a collector;

(g) removing remaining portions of said second mask, and removing any remaining portions of said first mask from said relief;

(h) forming first metallic contact layers for said emitter in said first opening and said collector in said second opening;

(j) forming a uniform second dielectric layer to a thickness $y_2$, where $y_1 < y_2 < x_1/2$, said second dielectric layer being a material etched at a same rate as said first dielectric layer;

(k) forming a planarizing layer on said second dielectric layer, and planarizing as far as said first dielectric layer;

(l) etching remaining portions of said planarizing layer, said second dielectric layer and said first dielectric layer as far as said second semiconductor layer, said planarizing layer being etched at a rate higher than an etching rate of said first and second dielectric layers, wherein side edges of said emitter remain covered by said first dielectric layer, and wherein remaining edges of said cavity remain covered by said second dielectric layer;

(m) forming a third mask having a third opening self-aligned about said emitter; said third opening exposing said second semiconductor layer, said second semiconductor layer becoming a base; and (n) forming second metallic contact layers for said base in said third opening.

2. A method according to claim 1, wherein said step (d) is carried out by the sub-steps of:
(i) depositing said first dielectric layer to a uniform thickness $e_1$ on both said second semiconductor layer and on said relief,
(ii) depositing a planarization layer on said first dielectric layer,
(iii) uniformly dry etching said planarization layer until said first dielectric layer appears above said relief,
(iv) anisotropically dry etching both said first dielectric layer and remaining portions of said planarization layer, said first dielectric layer being etched at a rate exceeding that of said planarization layer until said surface of said relief appears.

3. A method according to claim 2, wherein said first and second dielectric layers are selected from silica ($SiO_2$) and silicon nitride ($Si_3N_4$), and wherein said planarizing layer and said planarization layer are selected from photosensitive lacquers and polymerizable resins.

4. A method according to claim 2, wherein said step (h) is carried out by the sub-steps of:
(i) uniformly etching said planarizing layer and said second dielectric layer, and
(ii) ion machining said metallic contact layers, and wherein said metallic contact layer for said emitter remains because a portion of said second dielectric layer remains at a surface of said metallic contact layer for said emitter.

5. A method according to claim 4, wherein buried resistors of low ohmic values are simultaneously formed with said HBT by the additional steps of
(i) during said step (e) forming additional openings in said second mask, said additional openings being laterally separated from both said relief and said second opening;
(ii) during said step (f) etching at least two second cavities to said first semiconductor layer through said additional openings, said first semiconductor layer being a resistive semiconductor layer;
(iii) depositing a further mask in one of said two second cavities, said further mask protecting an effective region of a resistor at a surface of said resistive semiconductor layer; and
(iv) during said step (h) forming another of said first metallic contact layers in another of said two second cavities to be in contact with said resistive semiconductor layer.

6. A method according to claim 5, wherein following said step (iv) but before said step (j), said further mask is removed; wherein said steps (j) and (l) also form said second dielectric layer and said planarizing layer in said at least two second cavities; wherein said step (l) also etches said planarizing layer and said second dielectric layer to expose said another of said first metallic contact layers; and wherein metallic contact lines are formed to said another of said first metallic contact layers.

7. A method according to claim 5, wherein said one of said two second cavities is formed with a transverse dimension of $x_2$, where $x_2 < x_1$.

8. A method according to claim 1, wherein a heterojunction bipolar transistor (HBT) is formed of a n-p-n type, said heterojunction being situated between said second and third semiconductor layers, and wherein said first and second metallic contact layers are of an ohmic type with respective semiconductor layers on which said metallic contact layers are formed.

9. A method according to claim 1, wherein between step (b) and step (c) a further step is carried out of forming isolation regions at surrounding sides of said first, second and third semiconductor layers to limit active regions, said isolation regions being formed by one of proton implantation and boron implantation.

10. A method according to claim 1, wherein said substrate of semiconductor material is formed of one of semi-insulating gallium arsenide and silicon provided with a layer of semi-insulating gallium arsenide, and wherein said step (a) is carried out by
(i) forming said at least one first semiconductor layer from an about 0.5 μm thick layer of gallium arsenide having an n+ doping of about $5 \times 10^{18}$ at /cm$^3$, and an about 0.5 μm thick layer of gallium arsenide having an n- doping of about $5 \times 10^{16}$ at /cm$^3$;
(ii) forming said at least one second semiconductor layer from an about 0.1 μm thick layer of gallium arsenide having a p+ doping of about $10^{19}$ at /cm$^3$, and an about 0.01 μm thick layer of gallium arsenide being undoped; and
(iii) forming said at least one third semiconductor layer from an about 0.03 μm thick layer of gallium aluminum arsenide having an n doping of about $5 \times 10^{17}$ at /cm$^3$ with an aluminum concentration progressively increasing from 0 to 25%, an about 0.2 μm thick layer of gallium aluminum arsenide having an n doping of about $5 \times 10^{17}$ at /cm$^3$ with an aluminum concentration of about 25%, and an about 0.2 μm thick layer of gallium arsenide having an n+ doping of about $5 \times 10^{18}$ at /cm$^3$.

11. A method according to claim 1, wherein said first and second dielectric layers are selected from silica ($SiO_2$) and silicon nitride ($Si_3N_4$), and wherein said planarizing layer is selected from photosensitive lacquers and polymerizable resins.

12. A method according to claim 1, wherein said step (h) is carried out by the sub-steps of:
(i) uniformly etching said planarizing layer and said second dielectric layer, and
(ii) ion machining said metallic contact layers, and wherein said metallic contact layer for said emitter remains because a portion of said second dielectric layer remains at a surface of said metallic contact layer for said emitter.

13. A method according to claim 1, wherein buried resistors of low ohmic values are simultaneously formed with said HBT by the additional steps of
(i) during said step (e) forming additional openings in said second mask, said additional openings being laterally separated from both said relief and said second opening;
(ii) during said step (f) etching at least two second cavities to said first semiconductor layer through said additional openings, said first semiconductor layer being a resistive semiconductor layer;

(iii) depositing a further mask in one of said two second cavities, said further mask protecting an effective region of a resistor at a surface of said resistive semiconductor layer; and (iv) during said step (h) forming another of said first metallic contact layers in another of said two second cavities to be in contact with said resistive semiconductor layer.

14. A method according to claim 13, wherein following said step (iv) but before said step (j), said further mask is removed; wherein said steps (j) and (l) also form said second dielectric layer and said planarizing layer in said at least two second cavities; wherein said step (l) also etches said planarizing layer and said second dielectric layer to expose said another of said first metallic contact layers; and wherein metallic contact lines are formed to said another of said first metallic contact layers.

15. A method according to claim 13, wherein said one of said two second cavities is formed with a transverse dimension of $x_2$, where $x_2 < x_1$.

* * * * *